United States Patent [19]

Childs et al.

[11] 4,358,676
[45] Nov. 9, 1982

[54] HIGH SPEED EDGE ILLUMINATION PHOTODETECTOR

[75] Inventors: Richard B. Childs, Tarrytown; Peter S. Zory, Jr., Ossining, both of N.Y.

[73] Assignee: Optical Information Systems, Inc., Elmsford, N.Y.

[21] Appl. No.: 189,900

[22] Filed: Sep. 22, 1980

[51] Int. Cl.³ .................................................. H01J 40/14
[52] U.S. Cl. .................................. 250/211 J; 250/551
[58] Field of Search ............... 250/211 R, 211 J, 551; 357/30, 19; 350/96.1 Z, 96.13, 96.14; 455/610, 612

[56] References Cited

U.S. PATENT DOCUMENTS

| | | | |
|---|---|---|---|
| 3,422,323 | 1/1969 | Whoriskey | 250/211 J |
| 3,699,407 | 10/1972 | Gurtler et al. | 250/551 |
| 4,110,781 | 8/1978 | Konishi et al. | 250/551 |

*Primary Examiner*—David C. Nelms
*Attorney, Agent, or Firm*—Arthur L. Plevy

[57] ABSTRACT

A high speed photodetector, for use with semi-conductor lasers or the like, is configured to receive light signals upon a beveled detector facet, directing the incident light through a semiconductor window layer to the detector's junction region.

12 Claims, 4 Drawing Figures

HIGH SPEED EDGE ILLUMINATION PHOTODETECTOR

BACKGROUND OF THE INVENTION

The present invention relates to an opto-electronic device and in particular a high speed photodetector having a semiconductor window layer which is substantially transparent to the intended signal and further having a beveled detector edge which functions to direct incident photons to the device's junction region.

Optical communication systems require high speed photodetection. This requirement is best exemplified in semiconductor laser operations where photodetectors must respond to light modulations on the order of nanoseconds. Transport properties, inherent to the particular semiconductor material used, have heretofore generally limited the speed of the detector. The photodetector of the present invention minimizes inherent materials limitations in providing a novel photodetector arrangement to optimize the response of the detector for a given set of semiconductor absorbtion and transport properties.

Of equal importance is the photodetector's design which facilitates automated production and/or assembly of the device and its related optical components. Present optical communications technology generally employs subminiature devices and near future chip integration of entire optical systems is evident. The photodetector of the present invention is adapted to facilitate coplanar construction of such assemblies.

Photodetectors known in the art are generally characterizable as comprising one of two configurations. Referring momentarily to the drawings, FIG. 1 illustrates the two general configurations for photodetectors known in the art. The configuration generally designated 10 has a major surface area designated 12 for receiving illumination. The principal drawbacks of this configuration involves the required positioning of the detector in perpendicular relationship with the light source's substrate which virtually prohibits coplanar positioning of the detector and light source. A secondary drawback involves the absorbtion characteristics of the junction forming layer. Thick junction forming layers capable of absorbing sufficient light increases the transit time of photon generated carriers correspondingly increasing the response time of the device.

The detector arrangement of the present invention is of further advantage as eliminating the need for additional passivation layers to reduce surface recombination.

The prior art detector generally designated 20 is readily adaptable to chip integration construction techniques; however, this configuration generally absorbs light distant from the device junction, relying on carrier diffusion which reduces the speed of the device.

Both prior art detector configurations are of further disadvantage in permitting substantial reflection from the surface of the detector, which in instances may coherently add to the laser light signal providing unwanted second mode signals.

SUMMARY OF THE INVENTION

The present invention teaches a high speed photodectector whose configuration optimizes its response to an optical signal. The device is configured to receive light signals upon a beveled detector facet, directing the incident light through a semiconductor waveguide layer to traverse the semiconductor junction at a diagonal. The unique configuration is of further advantage in facilitating planar assembly with associated components and in particular associated light sources such as semiconductor lasers.

The dimensions of all Figures are greatly expanded and are not to scale, intended only to illustrate the present invention.

DETAILED DESCRIPTION OF THE INVENTION

Figure 1:
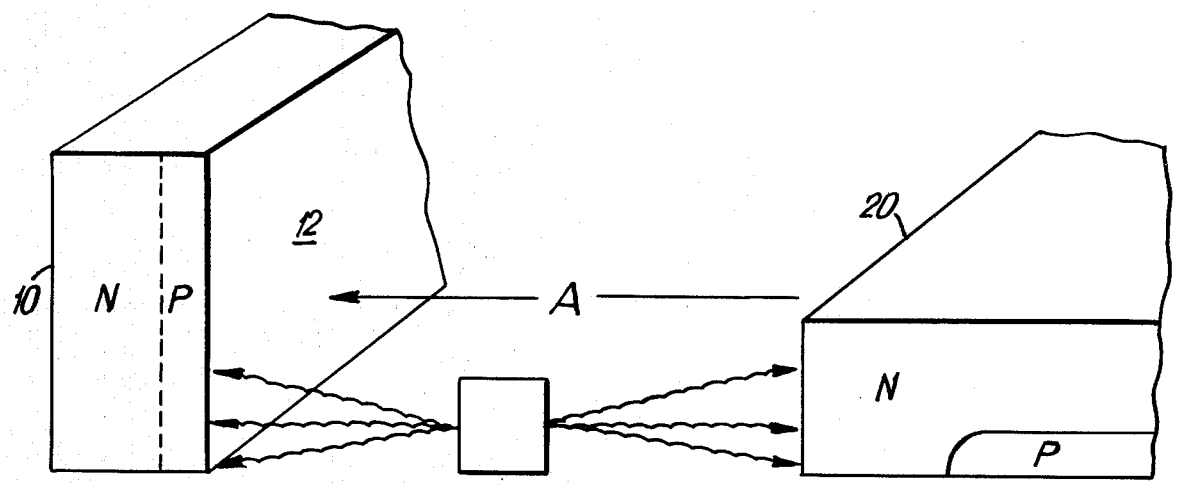
FIG. 1 illustrates, in perspective, two photodetector embodiments known in the art.
Figure 2:
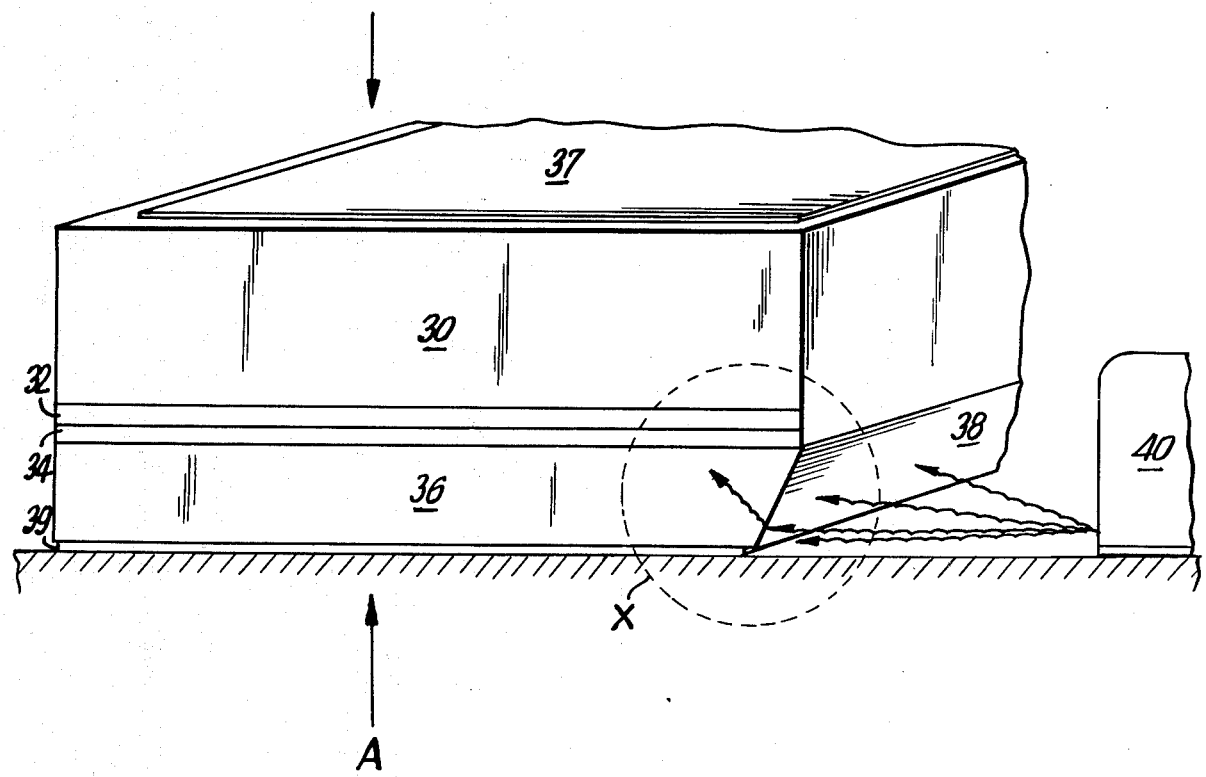
FIG. 2 illustrates a view in perspective of the photodetector of the present invention shown in relation to a light source including representative light rays emanating from the light source.
Figure 2A:
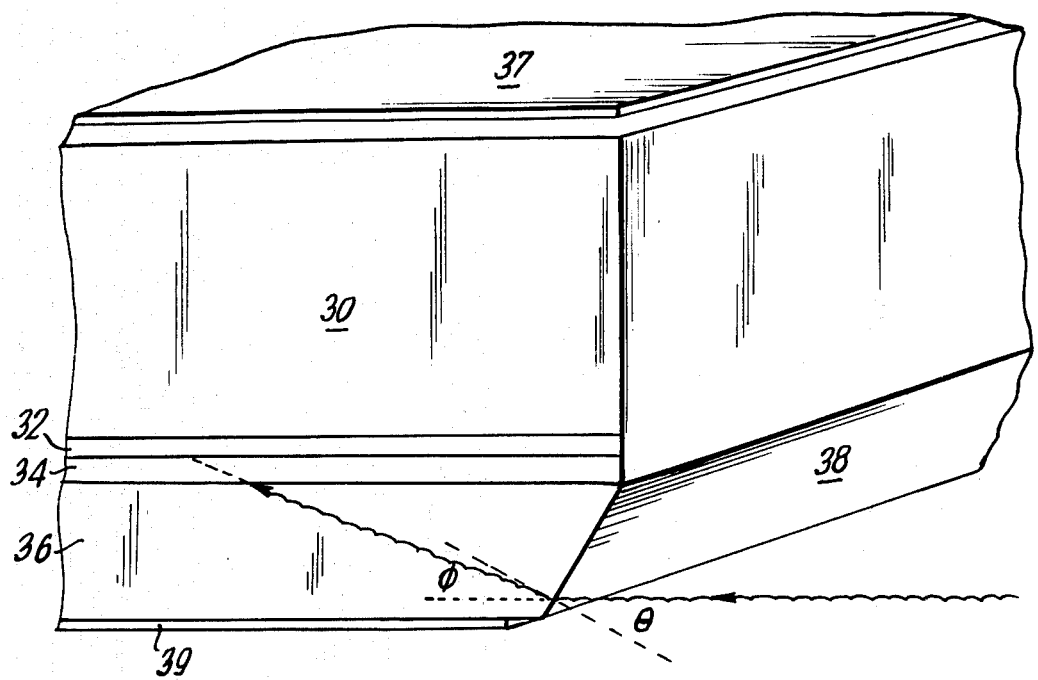
FIG. 2A is an exploded view of a segment of FIG. 2.

Illustrated in FIG. 2, the photodetector of the present invention comprises a substrate 30 of semiconductor material having uppermost and lowermost major area surfaces. In a typical construction of the photodetector, layer 30 comprises a relatively thick supportive substrate and preferably comprises a single crystal substrate grown from the generic semiconductor material used to construct the remainder of the device. Common to those of the art, and as used herein, "thick" semiconductor layers refer generally to layers in excess of about five (5) microns whereas relatively "thin" layers are less than about five (5) microns in thickness.

A first layer 32 comprises a relatively thin junction forming layer. Layer 32 may be constructed by a number of alternate techniques, each known in the art, including epitaxial growth or vacuum deposition of the layer onto layer 30, or controlled diffusion of a known dopant into layer 30.

In a preferred embodiment, substrate and first layers 30 and 32 comprise a first conductively type semiconductor. Layer 32 is suitably fabricated to position its Fermi level advantageous to forming a semiconductor junction to the overlying layer(s) described hereinafter.

A second layer 34 also comprises a relatively thin, junction forming layer, forming a semiconductor junction to contiguous layer 32. Similar to layer 32, layer 34 may be constructed by alternate techniques, known in the art, such as epitaxial growth or vacuum deposition, for example. Layer 34 is characterized as having a thickness T greater than or equal to an absorbtion length $a \approx 1/\beta$ where $\beta$ is the absorbtion coefficient of the material comprising layer 34 and less than or equal to the diffusion length of minority carriers in the semiconductor material comprising layer 34. It is to be recognized that materials' parameters for diffusion length L and absorbtion $\beta$ differ for differing semiconductor materials and also differ for varient doping levels for a given semiconductor material. Table I illustrates variations in minority carrier diffusion length, absorbtion coefficients and absorbtion lengths for varient doping conditions of two exemplary semiconductor materials, silicon and gallium arsenide.

TABLE I
DIFFUSION LENGTH

| | L | Absorbtion Coefficient $\beta$ | Absorbtion Length $a = 1/\beta$ |
|---|---|---|---|
| Undoped Silicon | 3100 μM | 600 cm$^{-1}$ | 17 μM |
| P-type Silicon, 1 × 10$^{16}$ | 1800 μM | 600 cm$^{-1}$ | 17 μM |
| N-type Silicon, 1 × 10$^{16}$ | 2800 μM | 600 cm$^{-1}$ | 17 μM |
| P-type GaAs 1 × 10$^{16}$ | 3 μM | 9100 cm$^{-1}$ | 1 μM |
| N-Type GaAs 1 × 10$^{16}$ | 12 μM | 9100 cm$^{-1}$ | 1 μM |

It should be further recognized that according to one aspect of the present invention, photons will traverse layer 34 at other than a normal to the major surface area of layer 34. Normal incidence as referenced herein, is along the directional plane indicated by Arrows A.

A fourth layer 36, comprises a relatively thick semiconductor waveguide layer. The semiconductor material comprising layer 36 is selected to be substantially transparent to the wavelength(s) of the anticipated detection signal. This is to say, light signals to be detected are of wavelengths λ which wavelengths are not strongly absorbed by layer 36, but pass through layer 36 with little absorbtion into layer 34 where light signals of wavelengths λ are strongly absorbed.

In one embodiment of the present invention, at least a surface region of the semiconductor substrate layer 30 may be suitably altered to form a semiconductor junction to contiguous semiconductor window layer 36, also suitably altered to form the aforedescribed junction.

In a preferred embodiment, the detector comprises a gallium arsenide photovoltaic device having a waveguide layer 36 comprising aluminum-gallium-arsenide, $Al_yGa_{1-y}As$, where $0 \leq y \leq 0.85$. Depending upon the concentration of the ternary Al constituent, layer 36 will be substantially transparent to light of wavelength λ where λ may range from about 860 nm for low percentages of aluminum, to a λ of about 700 nm for higher percentages of aluminum.

Figure 2B:
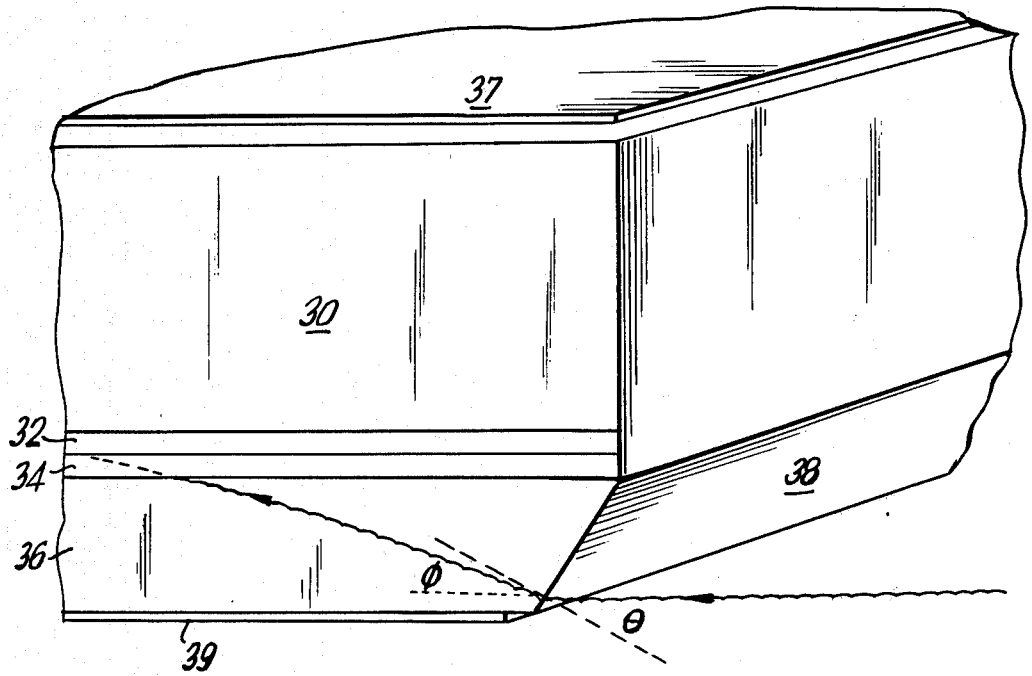
FIG. 2B is an exploded view of a segment of FIG. 2 including the graded index wave directing aspect of the present invention.

In a further preferred embodiment, window layer 36 comprises a continuous graded index wave directing layer. The term graded index herein refers to a selective alteration of the index of refraction through the semiconductor layer. Referring momentarily to FIG. 2B, in the present invention, layer 36 may be altered to provide a continuous graded index by selectively varying the ternary (in the case of higher order constituents, quaternary or higher order counterparts thereof) compound atomic constituent concentration through the thickness of layer 36. In so doing, radiation entering waveguide layer 38 at other than normal incidence to the major area surface will be refractively channeled along the junction region AlGaAs providing a traversal of the junction, increasing the probability of absorbtion within the junction.

Layer 36 is further characterized as having at least one beveled side region or facet, 38, hereinafter referred to as detector facet 38. The photodetector is positioned relative to the light emissive device, here illustrated at 40, to receive the light signals at least on the detector facet 38. In the device arrangement of the present invention, the major surface area plane of layers 30 thru 36 are substantially parallel with the intended direction of incident radiation and is coplanar with the support or substrate of light emissive device 40. In a preferred embodiment, light emissive device 40 comprises a semiconductor laser having an essentially cohesive light output of wavelength λ. As illustrated by the representative rays illustrated in the drawings, light from source 40 is typically divergent, incident upon facet 38 at virtually all angles. Therefore, incident light will be refractively waveguided toward the junction region depending upon the angle of incidence to detector facet 38. For example, a photon of wavelength λ is incident on the detector facet 38 at an angle of about $\theta$ to the perpendicular to that surface. The photon, passing from a first media (air) having a refractive index $n_1$ ($\approx 1.0$ for air) to a second media, the semiconductor waveguide layer 36 having a refractive index $n_2$. The photon is refracted at an angle $\phi$ toward the junction forming layers, passing through window layer 36 without being substantially absorbed, to junction layers 32/34 which are strongly absorbtive of photons of wavelength λ. The light signal is then absorbed in junction region, where photons are converted into electron hole pairs. As described heretofore, junction layer 34 is characterized as being of a thickness greater than about an absorption length $a \approx 1/\beta$ and less than or equal to about L, the diffusion length of minority carriers in the semiconductor material comprising layer 34.

Minority carriers absorbed in this layer diffuse toward the junction and are then swept away by the junction's electric field. The transit time for these carriers is given by $\tau \approx (d^2/2Dn)$ where d is the distance from the point the carrier is generated to the junction depletion region edge, and Dn is the minority carrier diffusion coefficient in the p-type layer. Since all carriers are absorbed within 2 μM of the junction, high speed response is possible without any external bias.

Anisotropic etching has been demonstrated favorable in providing controlled angle and controlled depth formation of the detector facet. Photolithography or silk screen printing may be used to accurately delineate the region of the semiconductor to be etched. Specific etchants, etchant concentrations, etchant times and temperatures will be dependent upon the particular semiconductor material used to fabricate layer 36, each being known in the art and comprising no part of the present invention.

Conventional ohmic contact electrodes, 37 and 39 are formed onto layers 30 and 36, respectively. Since the detector facet 38 is positioned on a side, as opposed to a major area surface of the detector, electrodes 37 and 39 may be coplanar with a common substrate for associated circuitry, facilitating integration of the photodetector. Furthermore, electrodes 37 and 39 need not be particularly patterned to facilitate illumination of the underlying layers.

To assist one skilled in the art, the following examples detail specific embodiments of the present invention.

EXAMPLE I

A photodetector was cnstructed to detect light signals of wavelength λ where 800 nm $\lesssim \lambda \lesssim$ 860 nm, characteristic of GaAs/AlGaAs semiconductor lasers. An n-type gallium arsenide (GaAs) single crystal wafer, approximately 15 mils, 380μ m in thickness, provided a substrate for liquid phase epitaxial growth of the hereinafter described photodetector layers. A barrier forming layer comprising a liquid phase epitaxially grown film of about two (2) microns of undoped ($N_D \approx 10^{16}$), but n-type gallium arsenide, was deposited onto the gallium arsenide substrate. The semiconductor junction was then formed by depositing a layer of p-type gallium arsenide, having a germanium doping level providing acceptor doping $N_A \approx 10^{17}$. The p-type gallium arsenide was also grown by liquid phase epitaxy to a thickness of about two (2) microns which is substantially less than the diffusion length of minority carriers in the p-type layer. The absorption coefficient for the p-type layer was about 1.0 for 800 nM<λ<860 nM, whereby virtually all of the light of that wavelength region would be absorbed within two (2) microns.

A window layer comprising about forty (40) microns of p-type aluminum gallium arsenide, $Al_{.4}Ga_{.6}As$ was deposited onto the p-type GaAs by liquid phase epitaxy. Aluminum gallium arsenide was selected to provide a substantially transparent semiconductor waveguide layer for wavelengths 800 nm<λ<860 nM.

A relatively thin "cap" layer of p-type gallium arsenide (about 0.2 microns), germanium doped to a level $N_A \approx 10^{18} cm^{-3}$, was deposited to ensure making a good ohmic contact to the aluminum gallium arsenide.

$SiO_2$ was pyrolitically deposited over the entire p-side surface of the wafer. Next the n-side was lapped until the wafer was 3 mils thick, and an ohmic contact was deposited on the n-side. Thirteen by sixteen mil windows were then opened in the $SiO_2$ by normal photoligraphy, and the p-side ohmic contact was electroplated through the openings in the $SiO_2$ mask. Two mil wide stripes were then opened in the $SiO_2$, adjacent to the longer (16 mil) side of the ohmic contacts, oriented along the (11$\bar{1}$) direction on the 100 surface of the wafer. The wafer was then anisotropically etched in a solution of $H_2SO_4:H_2O_2:H_2O$ (1:8:1) at 22° C. for 3 minutes to form a V groove with sidewalls forming an angle of about 30° with the [100] direction. Next the wafer was scribed from the n-side, with scribes alligned with the center of the v groove and perpendicular to the v groove, adjacent to the 13 mil side of the AgSn contact. In this manner, a beveled edge, consisting of one half of the v groove, was formed when the wafer is cleaved into chips.

A relatively thin metal layer was deposited onto the GaAs, forming an ohmic contact thereto. A second ohmic contact was deposited onto the gallium arsenide substrate, completing the construction of the photodetector.

For testing purposes the photodetector was secured to a copper block having the ohmic contact/N substrate major surface area facing upwardly. An alluminum-gallium-arsenide semiconductor laser, was situated in close proximity to the detector and positioned to have a portion of the laser signals irradiate the beveled detector facet of the photodetector. A high speed oscilloscope was used to evaluate the photodetectors response to the lasers' light signals λ ranging from about 800 nm to about 860 nm. The rise time of the photodetector was less than about 2 nanoseconds.

EXAMPLE 2

The photodetector of Example 2 is substantially similar to that described in Example 1 with the exception that the window layer of the example comprised a continuous graded index window layer. The photodetector of Example 2 is also substantially similar to the photodetector depicted in FIG. 2b, to which reference will be made. The window layer 36 was constructed of $Al_yGa_{1-y}As$ by epitaxial growth where the aluminum content was varied, substantially linearly, throughout the thickness of layer 36. The aluminum concentration was varied from an initial concentration of about 45%, $Al_{.45}Ga_{.55}As$, at about the interface of layers 34 and 36, to a reduced aluminum concentration of about 12%, $Al_{.12}Ga_{.78}As$, in the region near the ohmic electrode 39. As presently understood, the variation of the aluminum constituent will vary the refractive index n according to the relationship $\Delta n \approx -.62 \Delta Al_y$ whereby higher aluminum concentrations result in a lower refractive index and correspondingly a lower aluminum content resulting in a higher refractive index. The gradient variation in the aluminum constituent refractively "Bends" the beam within the window layer to traverse the junction layers at a greater angle, providing a longer absorption path. This in turn permits thinner barrier layers and faster photodetection response.

What is claimed is:

1. A high speed photodetector for detecting light signals of wavelength λ, said detector comprising:
   a substrate having a major area surface;
   a first layer of semiconductor material, deposited on said substrate's major area surface;
   a second layer of semiconductor material, contiguous with said first layer and forming a semiconductor junction thereto, said second layer being substantially absorptive of said light signals and further characterized as having a thickness T greater than about an absorption length a and less than about L being a diffusion length of minority carriers in said layer;
   a third layer of semiconductor material of a thickness greater than said second layer and having at least one detector facet whose surface is beveled relative to said major surface area, said detector facet being positioned to receive at least a portion of said light signals at said wavelength, said third layer being further characterized as comprising a material which is substantially transparent to said light signal.

2. The photodetector of claim 1 wherein said substrate and said first layer comprise n-type gallium arsenide, said second layer comprises p-type gallium arsenide and said third layer comprises p-type aluminum-gallium arsenide.

3. The photodetector of claim 2 wherein said light signal is of a wavelength λ ranging from about 700 nanometers to about 860 nanometers.

4. The photodetector of claim 2 wherein said first layer of n-type gallium arsenide is characterized as having a doping level providing donor impurities, $N_D$ less than about $1 \times 10^{17}$.

5. The photodetector of claim 2 wherein said third layer comprises $Al_{.4}Ga_{.6}As$.

6. The photodetector of claim 2 wherein said second layer comprises GaAs having a germanium doping level proving acceptor impurities, $N_a$, about equal to $10^{17}$ $cm^{-3}$.

7. A coplanar arrangement of a light emissive device and a photodetector comprising:
   a substrate;
   a light emissive device mounted on said substrate;
   a photodetector, having a junction region, said photodetector positioned proximate to and mounted on said substrate coplanar with said light device, said photodetector being characterized as further having a semiconductor layer proximate to said junction region, which is substantially transparent to said laser light and further having a detector facet which is beveled relative to said mounting substrate and positioned to receive at least a portion of said light signal wherein light output incident upon said detector facet is first directed through said transparent layer to be absorbed within a distance T of said junction region within said photodetector, said distance T being less than a diffusion length of minority carriers in said absorbing layer and greater than an absorption length in said layer.

8. A graded index photodetector for detecting light signals of wavelength λ, said photodetector comprising:
a first conductivity type layer of gallium arsenide;
means for making an ohmic contact to said layer;
a second conductivity type layer of gallium arsenide contiguous with said first conductivity type layer and forming a semiconductor junction thereto;
a third layer of thickness t comprising $Al_yGa_{1-y}As$, contiguous with said second conductivity type layer, where y is a percentage of aluminum at any given thickness of said third layer, y varying between zero to one contiguous with said gallium arsenide layer at a thickness t, said third layer having a detector facet which is beveled relative to a major surface area of said layer whereby said light signal being incident upon said detector facet is first refractively directed toward said junction and secondly is directed by said varying the percentage of aluminum in said third layer to traverse said semiconductor junction at an angle less than 90°.

9. The photodetector set forth in claim 8 wherein said percentage of aluminum in the third transparent layer comprising $Al_yGa_{1-y}As$ varies from y equal to about 0.45 contiguous with the gallium arsenide layer, to about 0.12 at thickness t.

10. The photodetector of claim 9 wherein said aluminum varies monotonically.

11. A high speed photodetector for detecting light signals of wavelength λ, said detector comprising:
a first semiconductor layer;
a second semiconductor layer contiguous with said first layer and forming a semiconductor junction thereto, said second layer being substantially absorptive of said light signals and having a thickness T greater than about an absorption length a and less than about L being a diffusion length of minority carriers in said layer, said first layer being further characterized as comprising a semiconductor material which is substantially transparent to light signals of wavelength λ and having at least one detector facet whose surface is beveled relative to a major surface area of said first layer, said detector facet being positioned to receive at least a portion of said light signals whereby said light signals incident upon said detector facet are directed to said semiconductor junction.

12. A high speed photodetector for detecting light signals of wavelength, said detector comprising:
a first semiconductor layer;
a second semiconductor layer contiguous with said first layer and being of same conductivity type;
a third semiconductor layer of conductivity type opposite that of said first and second layers and forming a junction to said second layer, said second layer being substantially absorptive of said light signals and having a thickness T greater than about an absorption length a and less than about L being a diffusion length of minority carriers in said layer, said first layer being further characterized as comprising a semiconductor material which is substantially transparent to light signals of wavelength λ and having at least one detector facet whose surface is beveled relative to a major surface area of said first layer, said detector facet being positioned to receive at least a portion of said light signals whereby said light signals incident on said detector facet are directed to said semiconductor junction.

* * * * *